(12) United States Patent
Abe et al.

(10) Patent No.: US 12,726,177 B2
(45) Date of Patent: Sep. 1, 2026

(54) QUARTZ CRYSTAL DEVICE, CRYSTAL UNIT, AND CRYSTAL OSCILLATOR

(71) Applicant: NIHON DEMPA KOGYO CO., LTD., Tokyo (JP)

(72) Inventors: Tomonori Abe, Saitama (JP); Takafumi Saitoh, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 939 days.

(21) Appl. No.: 18/075,414

(22) Filed: Dec. 6, 2022

(65) Prior Publication Data

US 2023/0223924 A1 Jul. 13, 2023

(30) Foreign Application Priority Data

Jan. 11, 2022 (JP) ................................ 2022-002080

(51) Int. Cl.

| | |
|---|---|
| ***H03H 9/00*** | (2006.01) |
| ***H03H 9/10*** | (2006.01) |
| ***H03H 9/19*** | (2006.01) |
| *H03B 5/32* | (2006.01) |

(52) U.S. Cl.

CPC ................ *H03H 9/19* (2013.01); *H03H 9/10* (2013.01); *H03B 5/32* (2013.01)

(58) Field of Classification Search

CPC .......... H03H 9/19; H03H 9/10; H03H 9/1014; H03H 9/13; H03B 5/32

See application file for complete search history.

(56) References Cited

U.S. PATENT DOCUMENTS

| | | | | |
|---|---|---|---|---|
| 7,123,108 B2 * | 10/2006 | Isimaru | ................ | H03H 9/1021 331/158 |
| 2004/0070462 A1 * | 4/2004 | Alhayek | .............. | H03H 9/1021 331/158 |
| 2021/0105000 A1 * | 4/2021 | Saitoh | ................. | H03H 9/0504 |

FOREIGN PATENT DOCUMENTS

| | | |
|---|---|---|
| JP | 2000323594 | 11/2000 |
| JP | 2013055573 | 3/2013 |
| JP | 2016139896 | 8/2016 |
| JP | 2017059978 | 3/2017 |
| JP | 2018056303 | 4/2018 |
| JP | 2019057871 | 4/2019 |
| JP | 2019068287 | 4/2019 |

OTHER PUBLICATIONS

"Office Action of Japan Counterpart Application", issued on Jul. 17, 2025, with English translation thereof, p. 1-p. 16.

* cited by examiner

*Primary Examiner* — Julio C. Gonzalez
(74) *Attorney, Agent, or Firm* — JCIPRNET

(57) ABSTRACT

A quartz crystal device includes a package and a crystal blank mounted inside the package. An area of a flat surface of a mounted surface of the blank is 10% or more and 30% or less with respect to an area of a flat surface specified by a width and a depth of the package.

3 Claims, 9 Drawing Sheets

QUARTZ CRYSTAL DEVICE, CRYSTAL UNIT, AND CRYSTAL OSCILLATOR

CROSS-REFERENCE TO RELATED APPLICATIONS

This application is based on and claims priority under 35 U.S.C. § 119 to Japanese Patent Application No. 2022-002080, filed on Jan. 11, 2022, the entire content of which is incorporated herein by reference.

TECHNICAL FIELD

This disclosure relates to a quartz crystal device, especially a quartz crystal device having an improved crystal impedance (CI) characteristic and also reducing the deterioration thereof caused by vibration noise.

DESCRIPTION OF THE RELATED ART

As a quartz crystal device in which a crystal element is installed in a ceramic package, there is a pedestal-provided quartz crystal device in which the crystal element is mounted on a pedestal secured to the package.

As the pedestal-provided quartz crystal device, there has been one in which the crystal element and the pedestal are adhesively secured to one another at four points using an adhesive agent.

Since such pedestal-provided quartz crystal device has a low G-sensitivity specification, it is important to reduce vibration noise, while it is also necessary to have a design that satisfies characteristics of crystal (such as constants and the CI).

Recently, regarding base stations for fifth generation (5G) communication that is rapidly spreading, the installation environment has been diversifying due to downsizing of the internal digital unit and the aggregation unit.

Due to such changes in the installation environment and downsizing, the influence of vibration caused by wind or a cooling fan on a crystal unit has become a problem.

Further, the advance of information communication, such as 4K/8K video communication, on-vehicle communication devices, and the Internet of Things (IoT), is remarkable, and to support these high-speed communications, a highly stabilized and high-quality vibrator whose characteristics deteriorate little by the environment is desired.

Blank Size and CI Characteristic: FIG. 6

FIG. 6 is an explanatory drawing indicating a relation between the blank (BK) areas (sizes) and the CI characteristics of crystal units.

As shown in FIG. 6, the smaller the blank size is, the worse the CI characteristic (S1) becomes, and the larger the blank size is, the better the CI characteristic (S1) becomes. In FIG. 6, the bold line in the center is a required line for a product (required specification), and the CI characteristic does not meet the requirements in the side above the bold line, while the CI characteristic does meet the requirements in the side below the bold line.

Note that the CI variation (S2) also shows a similar tendency with respect to the blank size.

Further, usually, the smaller the blank size is, the better the crystal unit becomes against vibration noise, and the larger the blank size is, the more the crystal unit is influenced by the vibration noise and thus deteriorates.

That is, the vibration noise characteristic becomes better as the blank size decreases, while the CI characteristic deteriorates. It can be understood that vibration noise and the CI characteristic have a trade-off relation.

As a related art of the pedestal-provided quartz crystal device, there is the "quartz crystal device" of Japanese Unexamined Patent Application Publication No. 2019-057871.

Japanese Unexamined Patent Application Publication No. 2019-057871 discloses a quartz crystal device with a structure that facilitates characteristic improvement and cost reduction by using a pedestal.

As described above, since the vibration noise and the CI characteristic have a trade-off relation according to the blank size, there has been a problem of difficulty in designing a quartz crystal device having an improved CI characteristic and also suppressing the influence of vibration noise.

Note that Japanese Unexamined Patent Application Publication No. 2019-057871 does not disclose a capability of improving the CI characteristic and also reducing the deterioration caused by vibration noise.

A need thus exists for a quartz crystal device which is not susceptible to the drawback mentioned above.

SUMMARY

According to an aspect of this disclosure, there is provided a quartz crystal device that includes a package and a crystal blank mounted inside the package. An area of a flat surface of a mounted surface of the blank is 10% or more and 30% or less with respect to an area of a flat surface specified by a width and a depth of the package.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

The following describes embodiments of this disclosure with reference to the drawings.

Outline of Embodiment

The quartz crystal device according to an aspect of this disclosure (the present quartz crystal device) includes a package and a crystal element (blank) mounted to a pedestal inside the package. The blank is adhered to the pedestal at four points. An area of a flat surface of a mounted surface of the blank is 10% or more and 30% or less with respect to an area of a flat surface specified by a width and a depth of the package. A CI characteristic can be improved and also deterioration caused by vibration noise can be reduced.

Especially, the present quartz crystal device in which the area of the flat surface of the blank is 13% or more and 18% or less with respect to the area of the flat surface of the package is further effective.

Figure 1:
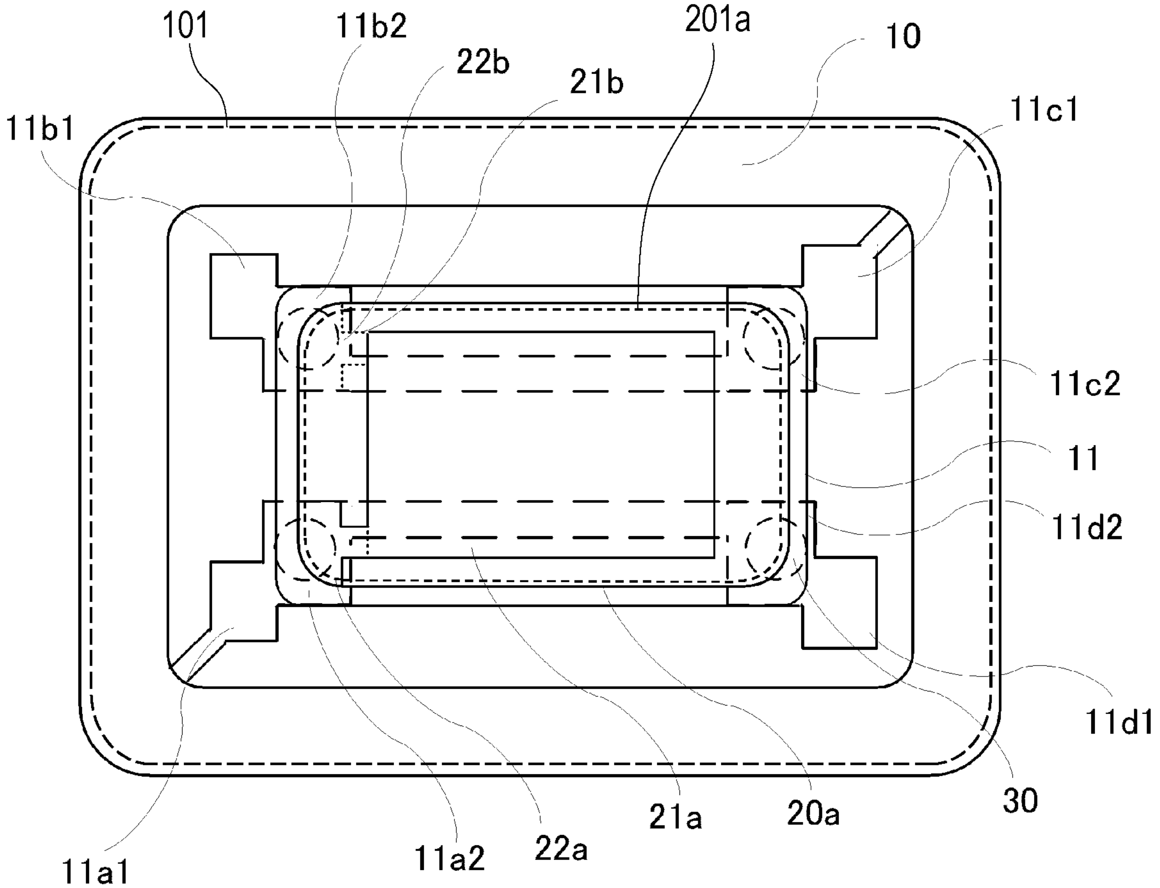
FIG. 1 is a plan view illustrating a configuration of a quartz crystal device (1)
Figure 2:
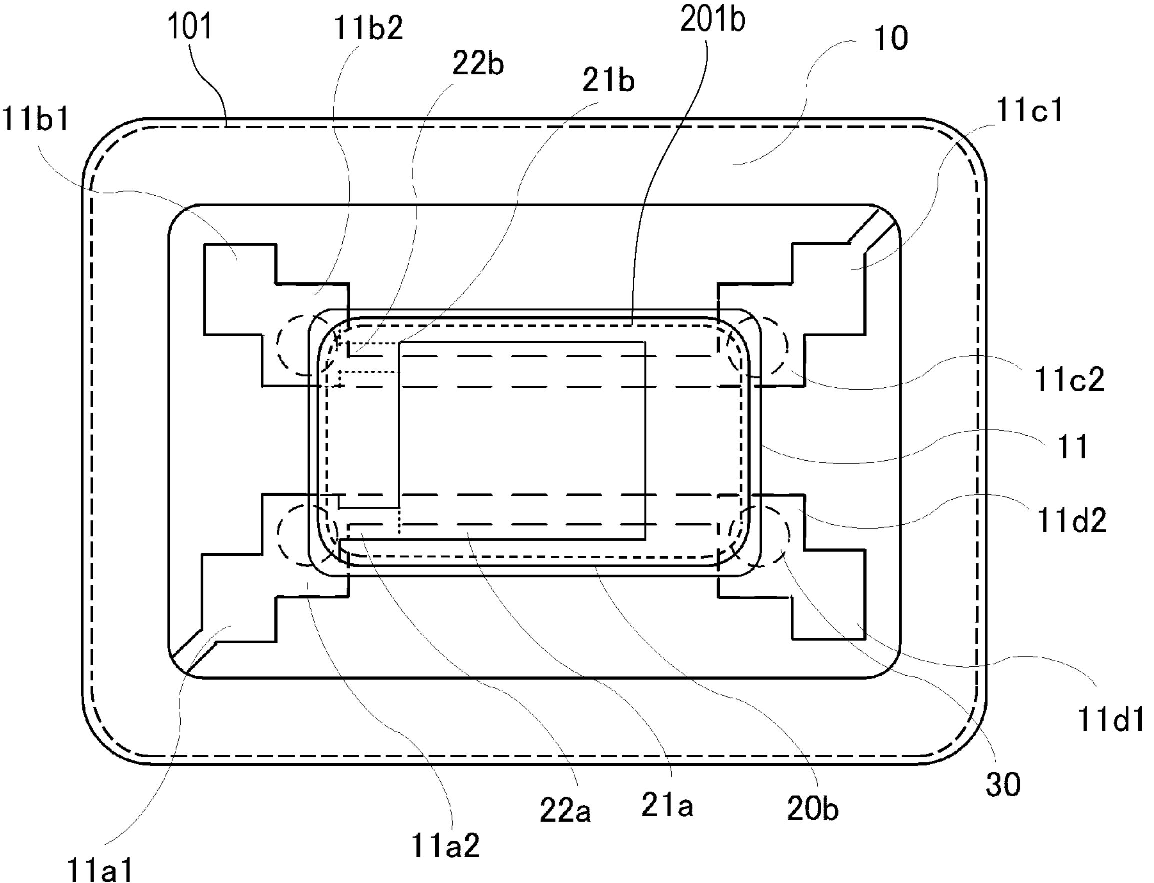
FIG. 2 is a plan view illustrating a configuration of a quartz crystal device (2)
Figure 3:
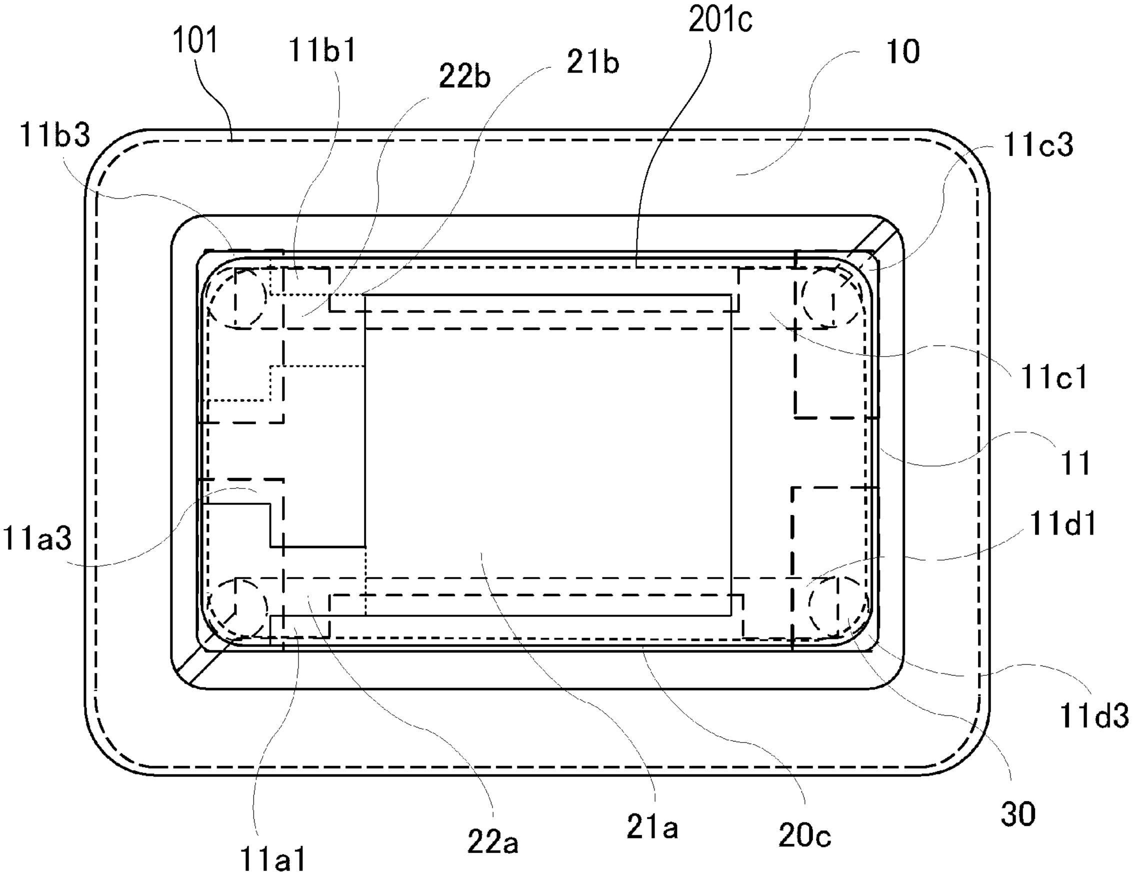
FIG. 3 is a plan view illustrating a configuration of a quartz crystal device (3)

Configuration of Present Quartz Crystal Device: FIG. 1 to FIG. 3

The present quartz crystal device will be described with reference to FIG. 1 to FIG. 3. FIG. 1 is a plan view illustrating a configuration of a quartz crystal device (1), FIG. 2 is a plan view illustrating a configuration of a quartz crystal device (2), and FIG. 3 is a plan view illustrating a configuration of a quartz crystal device (3).

In the present quartz crystal device, the package has a size of 3.2 mm in width (W), 2.5 mm in depth (D), and 0.72 mm in height (H). A proportion of the area of the flat surface of the mounted surface of the blank (hereinafter simply referred to as the "flat surface of the blank") is 10% or more and 30% or less with respect to the area of the flat surface specified by the width and the depth of the package (3.8 mm×2.5 mm) (hereinafter simply referred to as the "flat surface of the package").

Note that a blank 20*a* described in the quartz crystal device (1), a blank 20*b* described in the quartz crystal device (2), and a blank 20*c* described in the quartz crystal device (3) may by collectively referred to as a blank 20.

Quartz Crystal Device (1): FIG. 1

A first device (quartz crystal device (1)) of the present quartz crystal device will be described with reference to FIG. 1.

As shown in FIG. 1, the quartz crystal device (1) includes a depressed portion inside a package 10. On a front surface of a bottom surface of the depressed portion, first pattern portions 11*a*1, 11*b*1, 11*c*1, 11*d*1, and second pattern portions 11*a*2, 11*b*2, 11*c*2, 11*d*2 are formed. A pedestal 11 is disposed on the second pattern portions 11*a*2, 11*b*2, 11*c*2, 11*d*2, a crystal element (blank) 20*a* is disposed on the pedestal 11, and the blank 20*a* is secured to the second pattern portions 11*a*2, 11*b*2, 11*c*2, 11*d*2 via the pedestal 11 by an adhesive agent 30.

That is, the blank 20*a* is adhered to a front surface of the pedestal 11 at four points, the adhesive agent 30 is applied on a back surface of the pedestal 11, and the back surface of the pedestal 11 is adhered to the second pattern portions 11*a*2, 11*b*2, 11*c*2, 11*d*2.

The package 10 has a structure in which insulating materials, such as ceramic, are stacked, and includes the depressed portion in which the blank 20*a* is housed.

The pedestal 11 is formed of the same material as that of the package 10 or an insulating material, such as crystal, and the blank 20*a* is mounted via the second pattern portions 11*a*2, 11*b*2, 11*c*2, 11*d*2.

The first pattern portions 11*al*, 11*b*1, 11*c*1, 11*d*1 are formed in approximately rectangular shapes on four corners of a flat surface of the depressed portion (housing portion) inside the package 10, the 11*a*1 is connected to the closest corner portion of the depressed portion, the 11*c*1 is connected to the closest corner portion of the depressed portion, and the corner portions are connected to respective wiring patterns.

Further, the second pattern portions 11*a*2, 11*b*2, 11*c*2, 11*d*2 are connected to corner portions close to the center of the flat surface of the first pattern portions 11*a*1, 11*b*1, 11*c*1, 11*d*1 and formed in approximately rectangular shapes. That is, the second pattern portions are formed to extend from the first pattern portions toward the center of the flat surface.

Further, the second pattern portion 11*a*2 and the second pattern portion 11*d*2 are connected along one long side of the pedestal 11. The second pattern portion 11*b*2 and the second pattern portion 11*c*2 are connected along the other long side of the pedestal 11.

The adhesive agent 30 is a conductive adhesive agent or a non-conductive adhesive agent, and secures the blank 20*a* to the second pattern portions 11*a*2, 11*b*2, 11*c*2, 11*d*2 via the pedestal 11.

The blank 20*a* has an approximately rectangular shape, has a front surface on which an excitation electrode 21*a* is formed, and has a back surface on which an excitation electrode 21*b* is formed.

A pull-out portion 22*a* of the excitation electrode 21*a* on the front surface is pulled out in a short side direction on the left side of FIG. 1.

The excitation electrode 21*b* on the back surface is not seen in FIG. 1, but a pull-out portion 22*b* is pulled out in the short side direction on the left side.

The blank 20*a* is secured at two points to the second pattern portions 11*a*2, 11*b*2 on the left side and at two points to the second pattern portions 11*c*2, 11*d*2 on the right side by the adhesive agent 30.

Note that the first pattern portion 11*a*1 is connected to the wiring pattern in the corner portion (corner portion in the lower left of FIG. 1) of the depressed portion, and the second pattern portion 11*b*2 is connected to the wiring pattern in the corner portion (corner portion in the upper right of FIG. 1) of the depressed portion via the second pattern portion 11*c*2 and the first pattern portion 11*c*1.

Figure 7:
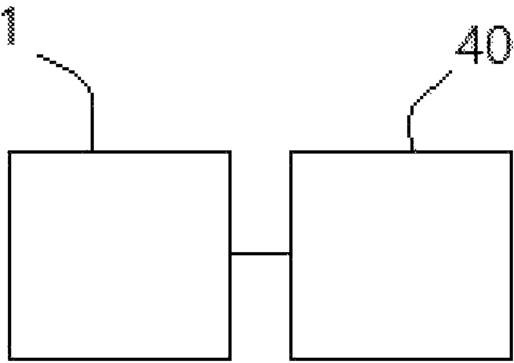
FIG. 7 illustrates the wiring patterns of the first device of FIG. 1 connecting to an IC.

The pull-out portions 22*a*, 22*b* of the excitation electrodes 21*a*, 21*b* formed on the blank 20*a* are connected to the second pattern portions 11*a*2, 11*b*2 by a conductive adhesive agent and finally connected to the wiring patterns. Then, the wiring patterns of the first device 1 are connected to an IC 40 (shown in FIG. 7) for oscillation.

The blank 20*a* and the second pattern portions 11*c*2, 11*d*2 may be connected by a non-conductive adhesive agent.

Here, the flat surface 101 of the package 10 has an area of 3.2 mm×2.5 mm, and the size of the flat surface 201*a* of the blank 20*a* of the quartz crystal device (1) is an area of 0.975 mm×1.240 mm. Thus, a proportion of the area of the flat surface 201*a* of the blank 20*a* to the area of the flat surface 101 of the package 10 is approximately 15.1%.

Quartz Crystal Device (2): FIG. 2

A second device (quartz crystal device (2)) of the present quartz crystal device is almost the same as the quartz crystal device (1) illustrated in FIG. 1, while the mounted blank 20*b* is downsized.

Due to the downsizing of the blank 20*b*, the excitation electrodes 21*a*, 21*b* and the pull-out portions 22*a*, 22*b* are also downsized.

Here, the flat surface 101 of the package 10 has an area of 3.2 mm×2.5 mm, and the size of the flat surface 201*b* of the blank 20*b* of the quartz crystal device (2) is an area of 0.852 mm×0.968 mm. Thus, a proportion of the area of the flat surface 201*b* of the blank 20*b* to the area of the flat surface 101 of the package 10 is approximately 10.3%.

Quartz Crystal Device (3): FIG. 3

In a third device (quartz crystal device (3)) of the present quartz crystal device, as shown in FIG. 3, the blank 20*c* is widened (enlarged) compared with the quartz crystal device (1) in FIG. 1. Needless to say, the blank 20*c* has a size that can be housed in the depressed portion of the package 10.

Due to the enlargement of the blank 20*c*, the second pattern portions are not disposed, and the first pattern portions 11$a$1, 11$b$1, 11$c$1, 11$d$1 are disposed on the front surface of the bottom surface of the depressed portion.

The pedestal 11 is mounted on the first pattern portions Hal, 11$b$1, 11$c$1, 11$d$1, and rectangular-shaped electrode patterns 11$a$3, 11$b$3, 11$c$3, 11$d$3 are formed on the front and back sides of the four corners of the pedestal 11. The blank 20$c$ is mounted on the pedestal 11 and the pull-out portions 22$a$, 22$b$ are connected to the electrode patterns 11$a$3, 11$b$3.

Here, the flat surface 101 of the package 10 has an area of 3.2 mm×2.5 mm, and the size of the flat surface 201$c$ of the blank 20$c$ of the quartz crystal device (3) is an area of 1.252 mm×1.800 mm. Thus, a proportion of the area of the flat surface 201$c$ of the blank 20$c$ to the area of the flat surface 101 of the package 10 is approximately 28.2%.

Figure 4A:
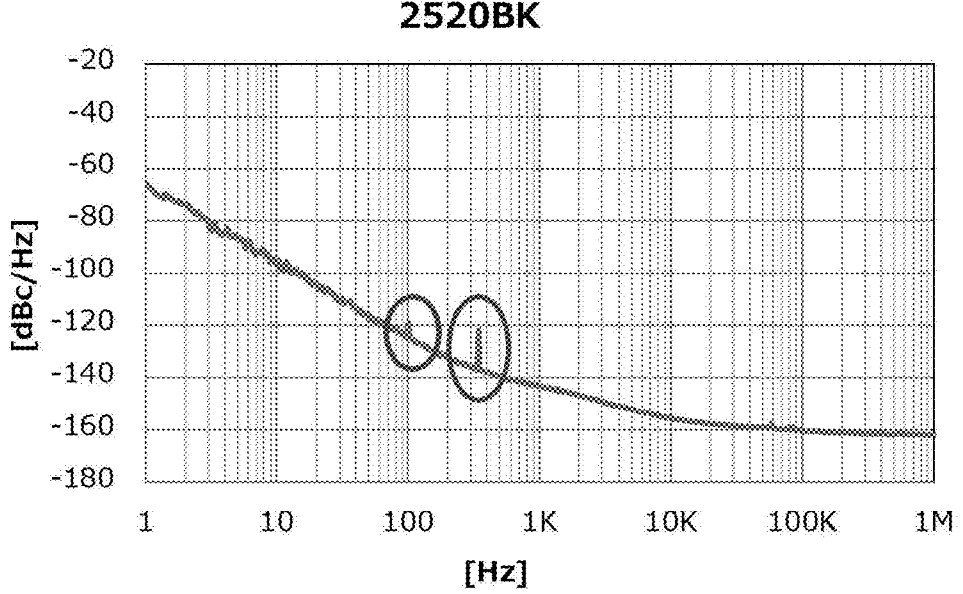
FIG. 4A to FIG. 4C are explanatory drawings indicating vibration noise characteristics.
Figure 4B:
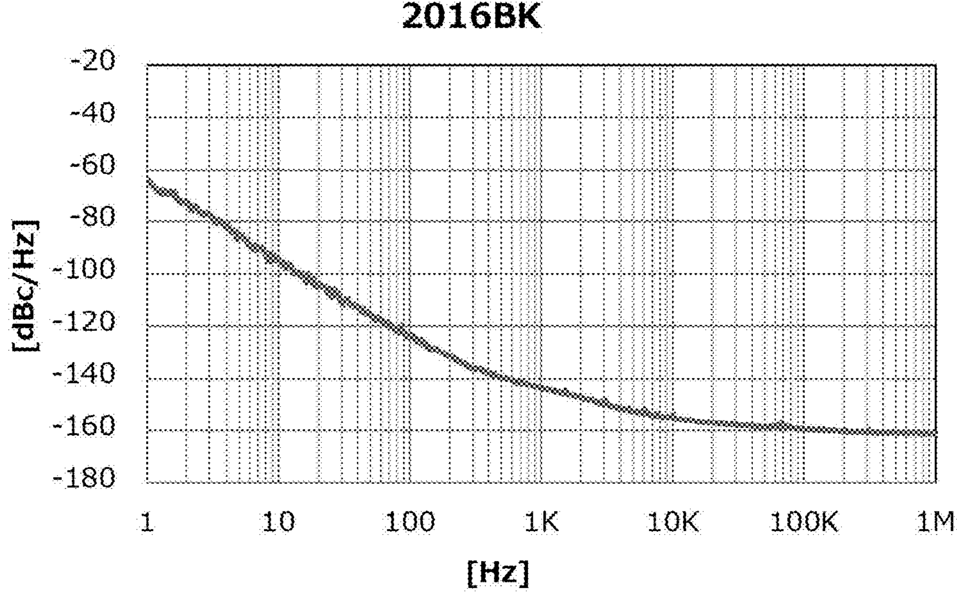
Figure 4C:
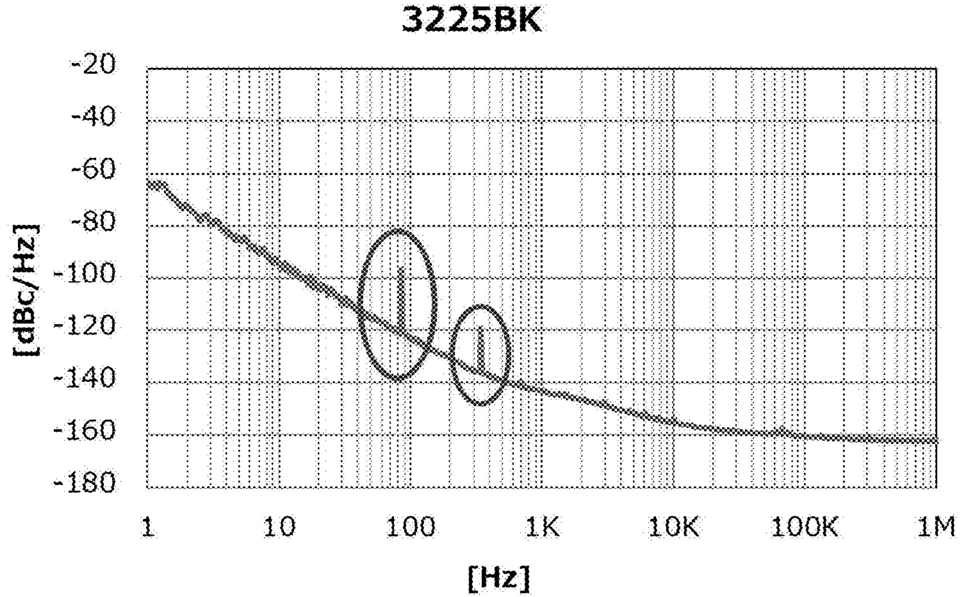

Vibration Noise Characteristic: FIG. 4A to FIG. 4C

Next, the vibration noise characteristics of the present quartz crystal device will be described with reference to FIG. 4A to FIG. 4C. FIG. 4A to FIG. 4C are explanatory drawings indicating the vibration noise characteristics. Note that FIG. 4A indicates the vibration noise characteristic of the quartz crystal device (1) in FIG. 1, FIG. 4B indicates the vibration noise characteristic of the quartz crystal device (2) in FIG. 2, and FIG. 4C indicates the vibration noise characteristic of the quartz crystal device (3) in FIG. 3.

In FIG. 4A to FIG. 4C, the parts encircled by an ellipse indicate spuriouses. In the quartz crystal device (2) having the smallest blank size, a spurious has not occurred and the vibration noise characteristic is excellent.

Next, in the quartz crystal device (1), although spuriouses have occurred, the spuriouses are smaller compared with those in the quartz crystal device (3) having the largest blank size, and the quartz crystal device (1) has an excellent vibration noise characteristic.

That is, the vibration noise characteristic gets better in the order of the quartz crystal device (3), the quartz crystal device (1), and the quartz crystal device (2).

Figure 5A:
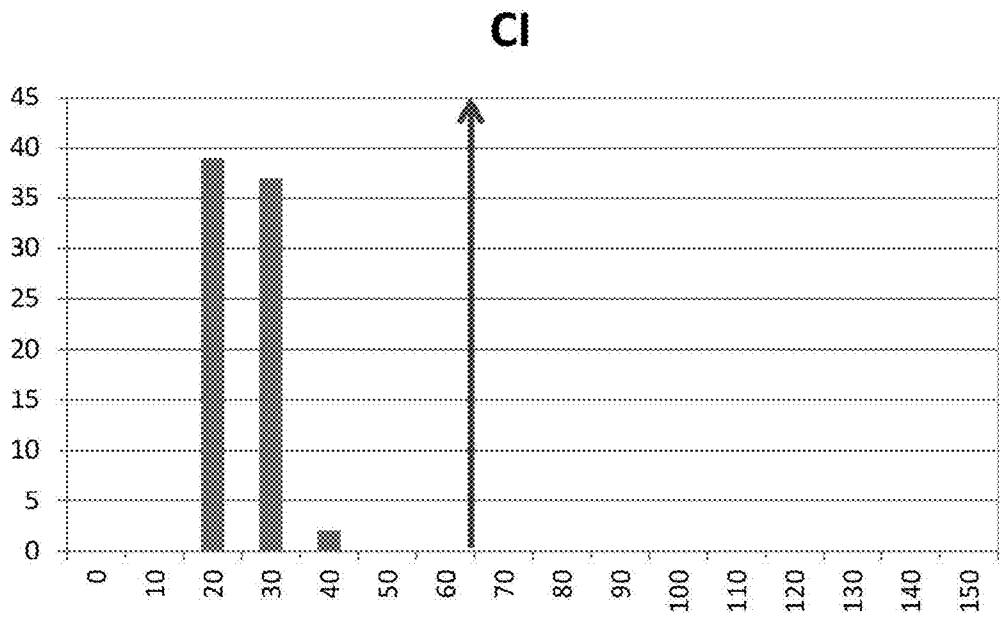
FIG. 5A to FIG. 5C are explanatory drawings indicating CI characteristics.
Figure 5B:
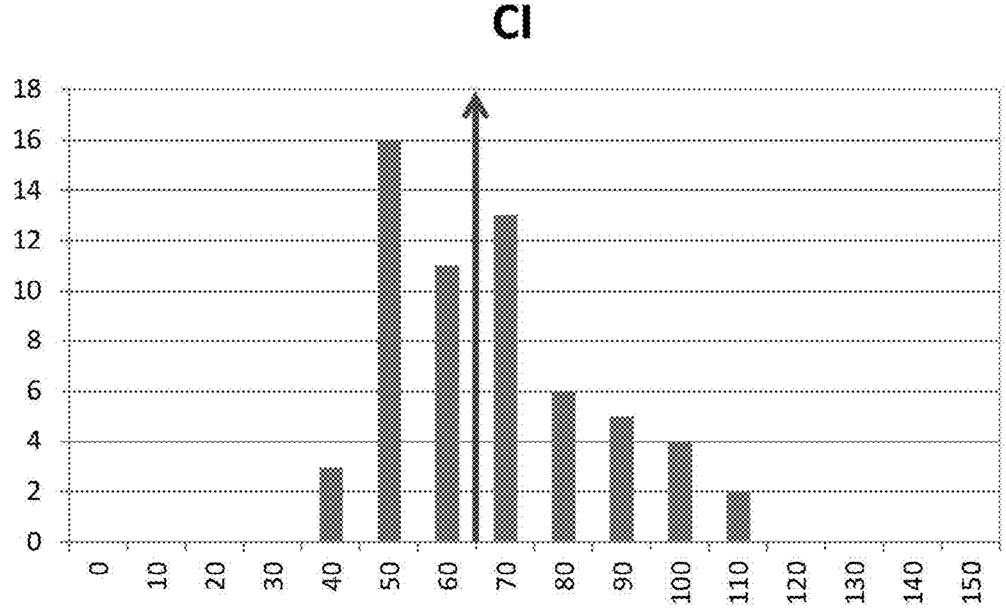
Figure 5C:
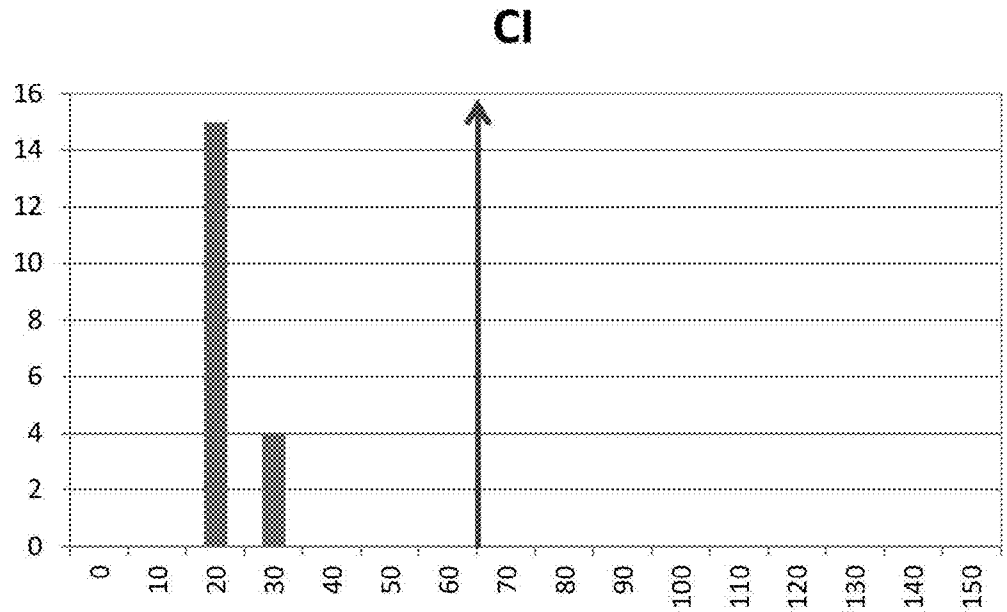
Figure 6:
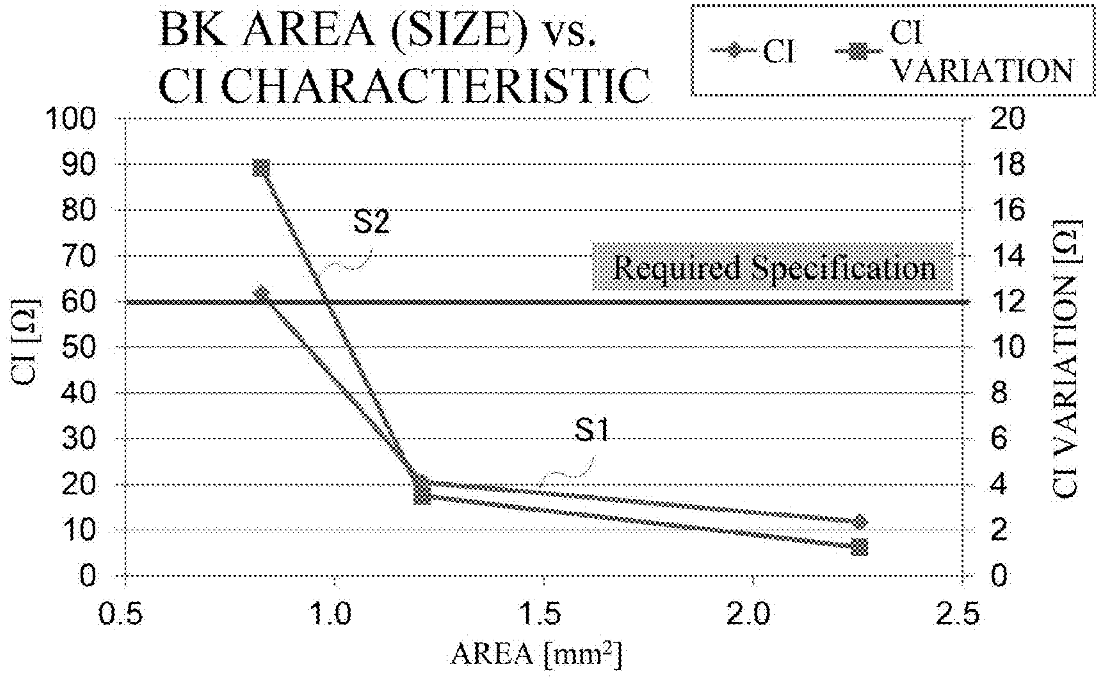
FIG. 6 is an explanatory drawing indicating a relation between blank sizes and the CI characteristics.

CI Characteristic: FIG. 5A to FIG. 5C

Next, the CI characteristics of the present quartz crystal device will be described with reference to FIG. 5A to FIG. 5C. FIG. 5A to FIG. 5C are explanatory drawings indicating the CI characteristics. Note that FIG. 5A indicates the CI characteristic of the quartz crystal device (1) in FIG. 1, FIG. 5B indicates the CI characteristic of the quartz crystal device (2) in FIG. 2, and FIG. 5C indicates the CI characteristic of the quartz crystal device (3) in FIG. 3. In each diagram from FIG. 5A to FIG. 5C, the horizontal axis indicates a resistance value [0], and the vertical axis indicates an occurrence frequency (count) at the resistance value.

In FIG. 5A to FIG. 5C, the CI characteristic is excellent in the order of the quartz crystal device (3) in FIG. 5C, next the quartz crystal device (1) in FIG. 5A, and finally the quartz crystal device (2) in FIG. 5B.

As described above, the vibration noise characteristic is excellent in the order of the quartz crystal device (2), the quartz crystal device (1), and the quartz crystal device (3), and the CI characteristic is excellent in the order of the quartz crystal device (3), the quartz crystal device (1), and the quartz crystal device (2).

Accordingly, the quartz crystal device having an excellent vibration noise characteristic and an excellent CI characteristic is the quartz crystal device (1).

In the quartz crystal device (1), the blank size is an area (1.209 $mm^2$) of 1.240 mm in width (lateral)×0.975 mm in depth (vertical), and the package has an area (8 $mm^2$) of 3.2 mm in width (lateral)×2.5 mm in depth (vertical). Thus, the proportion of the area of the flat surface of the blank 20$a$ to the area of the flat surface of the package 10 is approximately 15.1%. When this proportion is approximately 13% or more and 18% or less, an effect almost the same as that of the quartz crystal device (1) can be provided.

Note that, considering the balance between the vibration noise characteristic and the CI characteristic, the proportion of the area of the flat surface of the blank 20 to the area of the flat surface of the package 10 may be conveniently determined within a range of approximately 10% or more and 30% or less so as to include the quartz crystal devices (1) to (3).

Application to Product

While the embodiments of this disclosure have been described with a crystal unit as an example, this disclosure is applicable to an oscillator in which an IC is disposed below the pedestal 11 in the depressed portion of the package 10, or an oscillator in which the blank 20 is mounted in one of two depressed portions and an IC is disposed in the other of the two depressed portions of an H-shaped package.

For example, this disclosure is applicable to a Temperature Compensated Crystal Oscillator (TCXO), a crystal clock oscillator (ICXO), a Simple Packaged Crystal Oscillator (SPXO), and a Voltage Controlled Crystal Oscillator (VCXO).

Effects of Embodiment

The present quartz crystal device includes the package 10 and the blank 20 mounted to the pedestal 11 inside the package 10. The blank 20 is adhered to the second pattern portions 11$a$2, 11$b$2, 11$c$2, 11$d$2 formed on the front surface of the bottom surface of the depressed portion at four points via the pedestal 11. The area of the flat surface of the mounted surface of the blank 20 is 10% or more and 30% or less with respect to the area of the flat surface specified by the width and the depth of the package, and thus, the CI characteristic can be improved and also the deterioration caused by vibration noise can be reduced.

Especially, in the present quartz crystal device, since the area of the flat surface of the blank 20 is 13% or more and 18% or less with respect to the area of the flat surface of the package 10, an effect of further improving the CI characteristic and reducing the deterioration caused by vibration noise can be provided.

This disclosure is appropriate for a quartz crystal device that can improve the CI characteristic and also reduce the deterioration caused by vibration noise.

According to this disclosure, in the quartz crystal device, the area of the flat surface of the mounted surface of the blank is 13% or more and 18% or less with respect to the area of the flat surface specified by the width and the depth of the package.

According to this disclosure, the quartz crystal device includes a pedestal to which the blank is mounted, and first pattern portions disposed on four corners of an inner flat surface of the package and second pattern portions on the inner flat surface of the package. The second pattern portions are connected to the first pattern portions, and extend toward a center of the inner flat surface. The pedestal is mounted on the second pattern portions.

According to this disclosure, a crystal unit includes the quartz crystal device.

According to this disclosure, a crystal oscillator includes an oscillator circuit that amplifies an oscillation frequency and the quartz crystal device.

According to this disclosure, in the quartz crystal device, since the area of the flat surface of the mounted surface of the blank is 10% or more and 30% or less with respect to the area of the flat surface specified by the width and the depth of the package, an effect of improving the CI characteristic and also reducing the deterioration caused by vibration noise can be provided.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A quartz crystal device comprising a package;

a crystal blank mounted inside the package by an adhesive agent;

a pedestal to which the blank is mounted; and first conductive patterns disposed on four corners of an inner flat surface of the package and second conductive patterns on the inner flat surface of the package, wherein the second conductive patterns are connected to the first conductive patterns, and extend toward a center of the inner flat surface, and the pedestal is mounted on the second conductive patterns, wherein an area of a flat surface of a mounted surface of the blank is 10% or more and 30% or less with respect to an area of a flat surface specified by a width and a depth of the package.

2. The quartz crystal device according to claim 1, wherein the area of the flat surface of the mounted surface of the blank is 13% or more and 18% or less with respect to the area of the flat surface specified by the width and the depth of the package.

3. A crystal oscillator comprising an oscillator circuit that amplifies an oscillation frequency; and the quartz crystal device according to claim 1, wherein the oscillator circuit is electrically connected to the quartz crystal device.

* * * * *